(12) United States Patent
Jonas et al.

(10) Patent No.: US 8,721,928 B2
(45) Date of Patent: *May 13, 2014

(54) METHOD FOR THE PRODUCTION OF CONDUCTIVE POLYMERS

(75) Inventors: Friedrich Jonas, Aachen (DE); Udo Guntermann, Krefeld (DE)

(73) Assignee: Heraeus Precious Metals GmbH & Co. KG (DE)

( * ) Notice: Subject to any disclaimer, the term of this patent is extended or adjusted under 35 U.S.C. 154(b) by 383 days.

This patent is subject to a terminal disclaimer.

(21) Appl. No.: 12/864,007

(22) PCT Filed: Dec. 18, 2008

(86) PCT No.: PCT/EP2008/067884
§ 371 (c)(1),
(2), (4) Date: Oct. 22, 2010

(87) PCT Pub. No.: WO2009/092503
PCT Pub. Date: Jul. 30, 2009

(65) Prior Publication Data
US 2011/0049433 A1 Mar. 3, 2011

(30) Foreign Application Priority Data
Jan. 22, 2008 (DE) .................. 10 2008 005 568

(51) Int. Cl.
*H01B 1/12* (2006.01)
*C08G 61/12* (2006.01)

(52) U.S. Cl.
USPC .......................................... 252/500; 528/373

(58) Field of Classification Search
USPC .................................... 252/500; 528/373–378
See application file for complete search history.

(56) References Cited

U.S. PATENT DOCUMENTS

| | | | |
|---|---|---|---|
| 4,959,430 A | 9/1990 | Jonas et al. | |
| 4,987,042 A | 1/1991 | Jonas et al. | |
| 5,035,926 A | 7/1991 | Jonas et al. | |
| 5,300,575 A | 4/1994 | Jonas et al. | |
| 6,139,778 A * | 10/2000 | Angelopoulos et al. | 252/500 |
| 7,008,562 B2 | 3/2006 | Jonas et al. | |
| 7,116,549 B2 * | 10/2006 | Anzai et al. | 361/530 |
| 8,058,135 B2 | 11/2011 | Merker et al. | |
| 2006/0071201 A1 | 4/2006 | Jonas et al. | |
| 2008/0005878 A1 | 1/2008 | Merker et al. | |

FOREIGN PATENT DOCUMENTS

| | | |
|---|---|---|
| CA | 2148544 A1 | 11/1995 |
| CN | 1687175 A | 10/2005 |
| CN | 1839448 A | 9/2006 |
| DE | 10220684 A1 | 11/2003 |
| DE | 102007041722 A1 | 3/2009 |
| EP | 0339340 A2 | 11/1989 |
| EP | 0440957 A2 | 8/1991 |
| EP | 0686662 A2 | 12/1995 |
| EP | 1323764 A1 | 7/2003 |
| EP | 1373356 B1 | 5/2005 |
| JP | 3-7715 | 1/1991 |
| JP | 11-506497 T | 6/1999 |
| JP | 2003100561 A | 4/2003 |
| JP | 2006-286358 | 10/2006 |
| JP | 2007250993 A | 9/2007 |
| JP | 2009-508341 | 2/2009 |
| WO | WO-9805043 A1 | 2/1998 |
| WO | WO-03/048227 A1 | 6/2003 |
| WO | WO-2004/114326 A1 | 12/2004 |
| WO | WO-2007/031206 A1 | 3/2007 |

OTHER PUBLICATIONS

Liu et al "Structure, Conductivity, and Thermopower of Crystalline Polyaniline Synthesized by the Ultrasonic Irradition Polymerization Method", Macromolecules 2002, 35, 9414-9419.*
Information submitted by third party in corresponding Japanese Application No. JP 2010-543406 dated Apr. 4, 2013 with an English translation.
J. Y. Kim et al., "Enhancement of electrical conductivity of poly(3,4-ethylenedioxythiophene)/poly(4-styrenesulfonate) by a change of solvents", Synthetic Metals, vol. 126, pp. 311-316, 2002.
Japanese Examination Report issued in corresponding Japanese Application No. 2010-543406 dated May 28, 2013.
R. Asami, et al., "Development of a Novel Environmentally Friendly Electropolymerization of Water-Insoluble Monomers in Aqueous Electrolytes Uisng Acoustic Emulsifaction", Langmuir, vol. 22, pp. 10258-10263, 2006.
Groenendaal et al., "Poly(3,4-ethylenedioxythiophene) and Its Derivatives: Past, Present, and Future", Advanced Materials, vol. 12, No. 7, pp. 481-494, 2000.
Chinese Examination Report from corresponding Chinese Application No. 200880128193.1, dated Mar. 20, 2013.
Li, et al., "Application of ultrasonic irradiation in preparing conducting polymer as active materials for supercapacitor," *Materials Letters* (2005), vol. 59, pp. 800-803.
De Azevedo, et al., "Conductive polymer preparation under extreme or non-classical conditions," *J. Mater. Sci.* (2008), vol. 43, pp. 1400-1405.

* cited by examiner

*Primary Examiner* — Mark Kopec
(74) *Attorney, Agent, or Firm* — Novak Druce Connolly Bove + Quigg LLP

(57) ABSTRACT

The present invention relates to a novel process for preparing an aqueous or nonaqueous dispersion or solution comprising at least one conductive polymer and at least one polyanion, characterized in that the polymerization is performed with ultrasound irradiation, to aqueous or nonaqueous dispersions prepared by this process and to the use thereof.

12 Claims, No Drawings

METHOD FOR THE PRODUCTION OF CONDUCTIVE POLYMERS

CROSS-REFERENCE TO RELATED APPLICATIONS

This application is a national stage application (under 35 U.S.C. §371) of PCT/EP2008/067884 filed Dec. 18, 2008, which claims benefit of German application 10 2008 005 568.9, filed Jan. 22, 2008.

BACKGROUND OF THE INVENTION

The invention relates to a novel process for preparing conductive polymers in the presence of polyanions, to aqueous or nonaqueous dispersions or solutions prepared by this process and to their use.

Conductive polymers are gaining increasing economic significance since polymers have advantages over metals with regard to processability, to weight and to the controlled adjustment of properties by chemical modification. Examples of known π-conjugated polymers are polypyrroles, polythiophenes, polyanilines, polyacetylenes, polyphenylenes and poly(p-phenylene-vinylenes). Layers of conductive polymers have various industrial uses, for example as a polymeric counterelectrode in capacitors, as an antistatic coating or for through-contacting of electronic circuit boards.

Conductive polymers are prepared by chemical or electrochemical, oxidative means from monomeric precursors, for example optionally substituted thiophenes, pyrroles and anilines and their respective derivatives which may be oligomeric. Especially chemically oxidative polymerization is widespread, since it is technically simple to achieve in a liquid medium and on various substrates.

A particularly important and industrially utilized polythiophene is poly(ethylene-3,4-dioxythiophene) (PEDOT or PEDT), which is prepared by chemically polymerizing ethylene-3,4-dioxythiophene (EDOT or EDT) and which, in its oxidized form, has very high conductivities and is described, for example, in EP 339 340 A2. An overview of numerous poly(alkylene-3,4-dioxythiophene) derivatives, especially poly(ethylene-3,4-dioxythiophene) derivatives, and the monomer units, syntheses and applications thereof is given by L. Groenendaal, F. Jonas, D. Freitag, H. Pielartzik & J. R. Reynolds, Adv. Mater. 12, (2000) p. 481-494.

Particular industrial significance has been gained by dispersions of PEDOT with polystyrenesulphonic acid (PSS), as disclosed, for example, in EP 0440 957. WO 2007/031206 describes the preparation of low-viscosity PEDOT/PSS dispersions for internal impregnation of capacitors. The production process described there has the disadvantage of long reaction times, and that, after preparation of the dispersion, additional process steps are required to lower the viscosity of the dispersion, for example by high-pressure homogenization.

There was therefore still a need for a process for preparing conductive polymers which have a low viscosity.

BRIEF SUMMARY OF THE INVENTION

It was thus an object of the present invention to provide such a process.

It has now been found that, surprisingly, conductive polymers having a low viscosity—without additional process steps—can be prepared in short reaction times when the preparation is effected with ultrasound irradiation.

DETAILED DESCRIPTION OF THE INVENTION

The invention thus provides a process for preparing an aqueous or nonaqueous dispersion or solution comprising at least one conductive polymer and at least one polyanion, characterized in that the polymerization is performed with ultrasound irradiation.

In the context of the invention, conductive polymers may be optionally substituted polypyrroles, optionally substituted polyanilines or optionally substituted polythiophenes. It may also be that mixtures of two or more of these conductive polymers are prepared by the process according to the invention.

Particularly preferred conductive polymers are optionally substituted polythiophenes containing repeat units of the general formula (I)

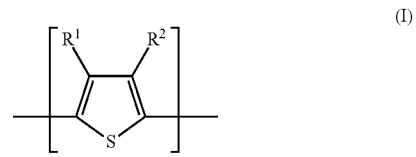

where
$R^1$ and $R^2$ are each independently H, an optionally substituted $C_1$-$C_{18}$-alkyl radical or an optionally substituted $C_1$-$C_{18}$-alkoxy radical, or
$R^1$ and $R^2$ together are an optionally substituted $C_1$-$C_8$-alkylene radical in which one or more carbon atoms may be replaced by one or more identical or different heteroatoms selected from O and S, preferably a $C_1$-$C_8$-dioxyalkylene radical, an optionally substituted $C_1$-$C_8$-oxythiaalkylene radical or an optionally substituted $C_1$-$C_8$-dithiaalkylene radical, or an optionally substituted $C_1$-$C_8$-alkylidene radical in which at least one carbon atom may optionally be replaced by a heteroatom selected from O and S.

In preferred embodiments, polythiophenes containing repeat units of the general formula (I) are those containing repeat units of the general formula (I-a) and/or of the general formula (I-b)

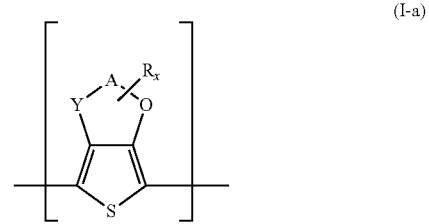

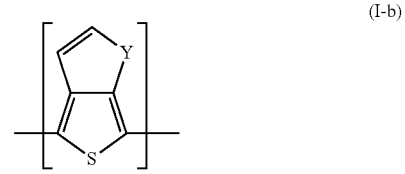

in which
A is an optionally substituted $C_1$-$C_5$-alkylene radical, preferably an optionally substituted $C_2$-$C_3$-alkylene radical,
Y is O or S,
R is a linear or branched, optionally substituted $C_1$-$C_{18}$-alkyl radical, preferably a linear or branched, optionally substituted $C_1$-$C_{14}$-alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical, x is an integer of 0 to 8, preferably 0, 1 or 2, more preferably 0 or 1, and in the case that a plurality of R radicals is bonded to A, they may be the same or different.

The general formula (I-a) should be understood such that the substituent R may be bonded x times to the alkylene radical A.

In further preferred embodiments, polythiophenes containing repeat units of the general formula (I) are those containing repeat units of the general formula (I-aa) and/or of the general formula (I-ab)

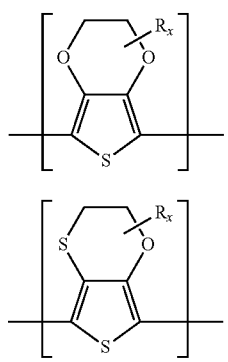

(I-aa)

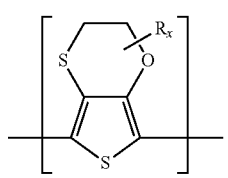

(I-ab)

in which
R and x are each as defined above.

In still further preferred embodiments, polythiophenes containing repeat units of the general formula (I) are those containing polythiophenes of the general formula (I-aaa) and/or of the general formula (I-aba)

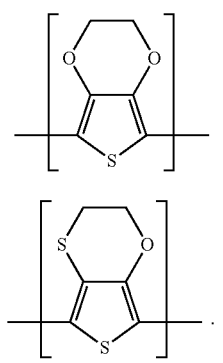

(I-aaa)

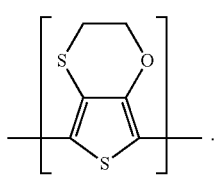

(I-aba)

In the context of the present invention, the prefix "poly" should be understood such that more than one identical or different repeat unit is present in the polythiophene. The polythiophenes contain a total of n repeat units of the general formula (I), where n may be an integer of 2 to 2000, preferably 2 to 100. The repeat units of the general formula (I) may each be the same or different within a polythiophene. Preference is given to polythiophenes containing in each case identical repeat units of the general formula (I).

On the end groups, the polythiophenes preferably bear H in each case.

In particularly preferred embodiments, the polythiophene with repeat units of the general formula (I) is poly(3,4-ethylenedioxythiophene), poly(3,4-ethyleneoxythiathiophene) or poly(thieno[3,4-b]thiophene, i.e. a homopolythiophene composed of repeat units of the formula (I-aaa), (I-aba) or (I-b), where Y in the formula (I-b) is S.

In further particularly preferred embodiments, the polythiophene with repeat units of the general formula (I) is a copolymer formed from repeat units of the formula (I-aaa) and (I-aba), (I-aaa) and (I-b), (I-aba) and (I-b), or (I-aaa), (I-aba) and (I-b), preference being given to copolymers formed from repeat units of the formula (I-aaa) and (I-aba), and also (I-aaa) and (I-b).

In the context of the invention, $C_1$-$C_5$-alkylene radicals A are methylene, ethylene, n-propylene, n-butylene or n-pentylene; $C_1$-$C_8$-alkylene radicals are additionally n-hexylene, n-heptylene and n-octylene. In the context of the invention, $C_1$-$C_8$-alkylidene radicals are $C_1$-$C_8$-alkylene radicals listed above containing at least one double bond. In the context of the invention, C1-C8-dioxyalkylene radicals, $C_1$-$C_8$-oxythiaalkylene radicals and $C_1$-$C_8$-dithiaalkylene radicals are the $C_1$-$C_8$-dioxyalkylene radicals, $C_1$-$C_8$-oxylthiaalkylene radicals and $C_1$-$C_8$-dithiaalkylene radicals corresponding to the $C_1$-$C_8$-alkylene radicals listed above. In the context of the invention, $C_1$-$C_{18}$-alkyl represents linear or branched $C_1$-$C_{18}$-alkyl radicals, for example methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl represents $C_5$-$C_{12}$-cycloalkyl radicals such as cyclopentyl, cyclohexyl, cycloheptyl, cyclooctyl, cyclononyl or cyclodecyl, $C_6$-$C_{14}$-aryl represents $C_6$-$C_{14}$-aryl radicals such as phenyl or naphthyl, and $C_7$-$C_{18}$-aralkyl represents $C_7$-$C_{18}$-aralkyl radicals, for example benzyl, o-, m-, p-tolyl, 2,3-, 2,4-, 2,5-, 2,6-, 3,4-, 3,5-xylyl or mesityl. In the context of the invention, C1-C18-alkoxy radicals are the alkoxy radicals corresponding to the C1-C18-alkyl radicals listed above. The above enumeration serves to illustrate the invention by way of example and should not be considered to be exclusive.

Optional further substituents of the above radicals include numerous organic groups, for example alkyl, cycloalkyl, aryl, halogen, ether, thioether, disulphide, sulphoxide, sulphone, sulphonate, amino, aldehyde, keto, carboxylic ester, carboxylic acid, carbonate, carboxylate, cyano, alkylsilane and alkoxysilane groups, and also carboxamide groups.

The abovementioned aqueous dispersions or solutions, preferably containing 3,4-polyalkylene-dioxythiophenes, can be prepared, for example, in analogy to the process with ultrasound irradiation described in EP 440 957. For this purpose, for example, it is possible to hang an ultrasound finger in the reaction medium. However, it is also possible to pump the reaction medium through an ultrasound flow cell. Here, the energy input may be between 10 and 1000 watts/litre (w/l) of reaction medium, preferably between 20 and 500 w/l of reaction medium, more preferably between 20 and 200 w/l of reaction medium.

For the process according to the invention, an ultrasound frequency between 20 and 200 kHz, preferably between 20 and 100 kHz, more preferably between 22 and 50 kHz, is used. Useful oxidizing agents and solutions likewise include those listed in EP 440 957.

After the preparation of the inventive dispersions, the dispersions are preferably treated with basic and acidic ion exchangers for the removal of inorganic salts.

In the context of this invention, an aqueous dispersion or solution is understood to mean a dispersion or solution which contains at least 50 percent by weight (% by weight) of water, more preferably at least 90% by weight of water, and optionally solvents which are—at least partly—miscible with water, such as alcohols, e.g. methanol, ethanol, n-propanol, isopropanol, butanol or octanol, glycols or glycol ethers, e.g. ethylene glycol, diethylene glycol, propane-1,2-diol, propane-1,3-diol or dipropylene glycol dimethyl ether, or ketones, for example acetone or methyl ethyl ketone. In the aqueous dispersion or solution, the solids content of optionally substituted polythiophenes, especially of optionally substituted polythiophenes containing repeat units of the general formula (I), may be between 0.05 and 4.0% by weight, preferably between 0.1 and 2.0% by weight.

In the context of the invention, a low-viscosity dispersion is understood to mean a dispersion which, at a solids content of optionally substituted polythiophenes of 1.0-1.5% by weight, has a viscosity at 20° C. between 1 and 100 mPas, preferably between 4 and 80 mPas, more preferably between 6 and 60 mPas, in each case measured with a rheometer at a shear rate of 100/sec.

Processes for preparing the monomeric precursors for the preparation of the polythiophenes of the general formula (I) and derivatives thereof are known to those skilled in the art and are described, for example, in L. Groenendaal, F. Jonas, D. Freitag, H. Pielartzik & J. R. Reynolds, Adv. Mater. 12 (2000) 481-494 and literature cited therein.

In the context of the invention, derivatives of the thiophenes mentioned above are understood to mean, for example, dimers or trimers of these thiophenes. Higher molecular weight derivatives, i.e. tetramers, pentamers, etc., of the monomeric precursors are also possible as derivatives. The derivatives may be formed either from identical or different monomer units and be used in pure form or else in a mixture with one another and/or with the thiophenes mentioned above. In the context of the invention, oxidized or reduced forms of these thiophenes and thiophene derivatives are also encompassed by the term "thiophenes and thiophene derivatives", provided that their polymerization forms the same conductive polymers as in the case of the thiophenes and thiophene derivatives listed above.

The thiophenes may optionally be used in the form of solutions. Suitable solvents include in particular the following organic solvents which are inert under the reaction conditions: aliphatic alcohols such as methanol, ethanol, i-propanol and butanol; aliphatic ketones such as acetone and methyl ethyl ketone; aliphatic carboxylic esters such as ethyl acetate and butyl acetate; aromatic hydrocarbons such as toluene and xylene; aliphatic hydrocarbons such as hexane, heptane and cyclohexane; chlorohydrocarbons such as dichloromethane and dichloroethane; aliphatic nitriles such as acetonitrile, aliphatic sulphoxides and sulphones such as dimethyl sulphoxide and sulpholane; aliphatic carboxamides such as methylacetamide, dimethylacetamide and dimethylformamide; aliphatic and araliphatic ethers such as diethyl ether and anisole. In addition, it is also possible to use water or a mixture of water with the aforementioned organic solvents as the solvent. Preferred solvents are alcohols and water, and also mixtures comprising alcohols or water, or mixtures of alcohols and water. Thiophenes which are liquid under the oxidation conditions can also be polymerized in the absence of solvents.

The aqueous dispersion or solution may additionally comprise at least one polymeric binder. Suitable binders are polymeric organic binders, for example polyvinyl alcohols, polyvinylpyrrolidones, polyvinyl chlorides, polyvinyl acetates, polyvinyl butyrates, polyacrylic esters, polyacrylamides, polymethacrylic esters, polymethacrylamides, polyacrylonitriles, styrene/acrylic ester, vinyl acetate/acrylic ester and ethylene/vinyl acetate copolymers, poly-butadienes, polyisoprenes, polystyrenes, polyethers, polyesters, polycarbonates, polyurethanes, polyamides, polyimides, polysulphones, melamine-formaldehyde resins, epoxy resins, silicone resins or celluloses. The solids content of polymeric binder is between 0 and 5.0% by weight, preferably between 0 and 2.0% by weight.

The dispersion or solution may additionally comprise adhesion promoters, for example organofunctional silanes or hydrolysates thereof, for example 3-glycidoxypropyltrialkoxysilane, 3-aminopropyltriethoxysilane, 3-mercaptopropyltrimethoxysilane, 3-metacryloxypropyltrimethoxysilane, vinyltrimethoxysilane or octyltriethoxysilane.

In the context of the invention, the nonaqueous dispersions or solutions comprising at least one conductive polymer, preferably optionally substituted polythiophenes, and at least one polyanion can be prepared in analogy to the processes disclosed in EP 1 373 356:

In a first process step, aqueous dispersions or solutions are prepared by the process according to the invention; in a second process step, a water-miscible solvent or a water-miscible solvent mixture is added to this aqueous dispersion or solution and then the water is removed at least partly from the resulting mixtures and optionally diluted with organic solvents. Useful solvents in this context are amidic solvents, for example formamide, N-methylacetamide, N,N-dimethylacetamide, N-methylpyrrolidone, N-methylcaprolactam or N-methylformamide, alcohols and ethers, for example ethylene glycol, glycerol, ethylene glycol dimethyl ether, ethylene glycol monomethyl ether, ethylene glycol monobutyl ether or dioxane. Preference is given to amidic solvents and solvents which possess a boiling point of more than 100° C. at standard pressure, and water-miscible solvents or water-miscible solvent mixtures which form an azeotrope with water. The water can be removed, for example, by membrane processes such as ultrafiltration, or by distillation. If there is dilution with organic solvents, preferred solvents are the abovementioned solvents and aliphatic alcohols, for example methanol, ethanol, n-propanol, isopropanol, n-butanol, isobutanol, tert-butanol, amyl alcohol, isoamyl alcohol, neopentyl alcohol, aliphatic ketones, for example acetone, methyl ethyl ketone, methyl isobutyl ketone, methyl tert-butyl ketone, ethers, for example tetrahydrofuran, methyl tert-butyl ether, esters of aliphatic and aromatic carboxylic acids, for example ethyl acetate, butyl acetate, glycol monomethyl ether acetate, butyl phthalate, or aliphatic or aromatic hydrocarbons such as pentane, hexane, cyclohexane, octane, isooctane, decane, toluene, o-xylene, m-xylene or p-xylene.

The conductive polymers, especially the polythiophenes, may be uncharged or cationic. In preferred embodiments they are cationic, "cationic" relating only to the charges which reside on the polythiophene main chain. According to the substituent on the R radicals, the polythiophenes may bear positive and negative charges in the structural unit, in which case the positive charges are present on the polythiophene main chain and the negative charges, if present, on the R radicals substituted by sulphonate or carboxylate groups. The positive charges of the polythiophene main chain may be saturated partly or fully by anionic groups which may be present on the R radicals. Viewed overall, the polythiophenes in these cases may be cationic, uncharged or even anionic. Nevertheless, they are all considered to be cationic polythiophenes in the context of the invention, since the positive charges on the polythiophene main chain are crucial. The positive charges are not shown in formulae, since their exact number and position cannot be stated unambiguously. The number of positive charges is, however, at least 1 and at most n, where n is the total number of all repeat units (identical or different) within the polythiophene.

To compensate for the positive charge, if this is not already done by the optionally sulphonate- or carboxylate-substituted and thus negatively charged R radicals, the cationic polythiophenes require anions as counterions.

Useful counterions include monomeric or polymeric anions, the latter also referred to hereinafter as polyanions.

The monomeric anions used are, for example, those of $C_1$-$C_{20}$-alkanesulphonic acids, such as methane-, ethane-, propane- or butanesulphonic acid, or higher sulphonic acids, such as dodecanesulphonic acid, of aliphatic perfluorosulphonic acids, such as trifluoromethanesulphonic acid, perfluorobutanesulphonic acid or perfluorooctanesulphonic acid, of aliphatic $C_1$-$C_{20}$-carboxylic acids such as 2-ethylhexylcarboxylic acid, of aliphatic perfluorocarboxylic acids, such as trifluoroacetic acid or perfluorooctanoic acid, and of aromatic sulphonic acids optionally substituted by $C_1$-$C_{20}$-alkyl groups, such as benzenesulphonic acid, o-toluenesulphonic acid, p-toluenesulphonic acid, dodecylbenzenesulphonic acid, dinonylnaphthalenesulphonic acid or dinonylnaphthalenedisulphonic acid, and of cycloalkanesulphonic acids such as camphorsulphonic acid, or tetrafluoroborates, hexafluorophosphates, perchlorates, hexafluoroantimonates, hexafluoroarsenates or hexachloroantimonates.

Particular preference is given to the anions of p-toluenesulphonic acid, methanesulphonic acid or camphorsulphonic acid.

It is also possible for anions of the oxidizing agent used or anions formed therefrom after reduction to serve as counterions, such that addition of additional counterions is not absolutely necessary.

Preferred polymeric anions are, for example, anions of polymeric carboxylic acids, such as polyacrylic acids, polymethacrylic acids or polymaleic acids, or polymeric sulphonic acids, such as polystyrenesulphonic acids and polyvinylsulphonic acids. These polycarboxylic and polysulphonic acids may also be copolymers of vinylcarboxylic and vinylsulphonic acids with other polymerizable monomers, such as acrylic esters and styrene. They may, for example, also be partly fluorinated or perfluorinated polymers containing $SO_3^-M^+$ or $COO^-M^+$ groups, where $M^+$ is, for example, $Li^+$, $Na^+$, $K^+$, $Rb^+$, $Cs^+$ or $NH_4^+$, preferably $H^+$, $Na^+$ or $K^+$.

A particularly preferred polymeric anion is the anion of polystyrenesulphonic acid (PSS) as the counterion.

The molecular weight of the polyacids which afford the polyanions is preferably 1000 to 2 000 000, more preferably 2000 to 500 000. The polyacids or their alkali metal salts are commercially available, for example polystyrenesulphonic acids and polyacrylic acids, or else are preparable by known methods (see, for example, Houben Weyl, Methoden der organischen Chemie [Methods of organic chemistry], Vol. E 20 Makromolekulare Stoffe [Macromolecular substances], part 2, (1987), p. 1141 ff.).

Cationic polythiophenes which contain anions as counterions for charge compensation are also often referred to in the technical field as polythiophene/(poly)anion complexes.

The polymerization is performed preferably at a temperature within a range of 0-35° C., more preferably at a temperature within a range of 5-25° C. and most preferably at a temperature within a range of 10-20° C.

The polymerization time is between 0.1 and 48 hours (h), preferably between 0.5 and 24 h, more preferably between 1.0 and 10 h.

The present invention further provides a process for preparing an aqueous or nonaqueous dispersion or solution comprising at least one conductive polymer and at least one polyanion, characterized in that the process comprises the following steps:
1) adding at least one oxidizing agent only after the reaction medium has been inertized with the aid of inert gas,
2) performing the polymerization with ultrasound irradiation.

In the context of the invention, the reaction medium is considered to be inertized when the inert gas has been passed through the reaction medium for at least 5 minutes, preferably at least 20 minutes. Suitable inert gases are, for example, argon, helium or nitrogen. The reaction medium is also considered to be inertized when the internal pressure of the reaction vessel has been lowered at least once and the internal pressure has subsequently been raised by adding inert gas.

DE 10 2007 041722.7, which was yet to be published at the priority date of the present application, describes the preparation of conductive polymers under reduced pressure.

The present invention still further provides a process for preparing an aqueous or nonaqueous dispersion or solution comprising at least one conductive polymer and at least one polyanion, characterized in that the process comprises the following steps:
performing the polymerization at a pressure below atmospheric pressure and with ultrasound irradiation.

The polymerization here is preferably performed at a pressure below 800 hPa, preferably below 200 hPa, most preferably below 50 hPa.

For these two further processes according to the invention, the same preferred ranges apply, for example for at least one conductive polymer, at least one polyanion and the ultrasound irradiation, as for the first process according to the invention specified.

In order to enhance the conductivity of the aqueous or nonaqueous dispersions or solutions, it is possible in the context of the invention to add conductivity enhancers such as dimethyl sulphoxide. However, other conductivity enhancers as disclosed in EP 0686662 or by Ouyang et al., Polymer, 45 (2004), p. 8443-8450 can also be used as conductivity enhancers in the context of the invention. The conductivities attainable may be up to 2000 S/cm, preferably 1000 S/cm.

The present invention further provides aqueous or nonaqueous dispersions or solutions which are prepared by the processes according to the invention, and also the use of these aqueous or nonaqueous dispersions or solutions for producing conductive coatings. The conductivies of the coatings thus produced are at least 150 S/cm, preferably at least 200 S/cm.

The examples which follow serve merely to illustrate the invention by way of example and should not be interpreted as a restriction.

EXAMPLES

Comparative Example

A 200 ml glass vessel provided with a cooling jacket was initially charged with 79.74 g of water and 0.39 g of 3,4-ethylenedioxythiophene. The emulsion was stirred on a magnetic stirrer with water cooling. Subsequently, 15.03 g of aqueous polystyrenesulphonic acid having a mean molecular weight $M_w$ of 70 000 g/mol and a solids content of 5%, 0.22 g of iron(III) sulphate dissolved in 3.87 g of water, and 0.76 g of sodium peroxodisulphate were added. The reaction mixture was subsequently stirred on the magnetic stirrer with cooling for a further 3 hours (h), in the course of which the dispersion became highly viscous. After the magnetic stirrer had been switched off, the solution gelated.

Inventive Example 1

A 200 ml glass vessel provided with a cooling jacket was initially charged with 79.74 g of water and 0.39 g of 3,4-ethylenedioxythiophene. The emulsion was emulsified with an ultrasound finger (24 kHz, power 100 W, Hielscher UP 200 S ultrasound processor) while cooling externally with water for 15 minutes (min). Subsequently, 15.03 g of aqueous polystyrenesulphonic acid having a mean molecular weight $M_w$ of 70 000 g/mol and a solids content of 5%, 0.22 g of iron(III) sulphate dissolved in 3.87 g of water, and 0.76 g of sodium peroxodisulphate were added. The reaction mixture was subsequently irradiated with an ultrasound finger (Hielscher UP 200 S ultrasound processor, 24 kHz, power 100 W) while cooling externally with water for a further 3 h. Within this time, the reaction temperature rose from 20° C. to 35° C. After the reaction had ended, the dispersion was desalinated by adding 26 g of Lewatit MP 62 (basic ion exchanger, Lanxess AG) and 45 g of Lewatit S 100 (acidic ion exchanger, Lanxess AG) with stirring on a magnetic stirrer without ultrasound for 2 h. The ion exchanger was then filtered off through a filter cloth.

The inventive PEDOT/PSS dispersion thus obtained has a solids content of 1.0% by weight and a viscosity of 7.9 mPas at a shear rate of 100/sec (measured with a rheometer at 20° C.).

Determination of the Conductivity 19 g of this dispersion were admixed with 1 g of dimethyl sulphoxide. A cleaned glass substrate was placed onto a spin coater and 10 ml of the abovementioned mixtures were distributed on the substrate. Subsequently, the supernatant solution was spun off by rotating the plate. Thereafter, the substrate thus coated was dried on a hotplate at 130° C. for 15 min. The layer thickness was 70 nm (Tencor, Alphastep 500).

The conductivity was determined by applying silver electrodes of length 2.5 cm at a distance of 10 mm by means of a shadowmask. The surface resistance determined with an electrometer (Keithly 614) was multiplied by the layer thickness in order to obtain the electrical specific resistivity. The specific resistivity of the layer was 0.005747 ohm·cm. This corresponds to a conductivity of 174 S/cm. The layers thus produced are clear.

Inventive Example 2

A 2 l stirred vessel with cooling jacket, stirrer, nitrogen inlet and outlet, liquid inlet and outlet via immersed tubes was initially charged with 1389 g of deionized water. Subsequently, 74.4 g of a 25% aqueous polystyrenesulphonic acid solution with a mean molecular weight $M_w$ of 70 000 g/mol were added. The solution was freed of oxygen by introducing nitrogen with stirring for 2 h. After addition of 7.4 g of 3,4-ethylenedioxythiophene under nitrogen, the solution was pumped at 10 l/h through an ultrasound flow cell from Dr. Hielscher GmbH, Stuttgart, Flow Cell D22K, Ultrasonic Processor UP400S, with stirring and irradiated with a power of 400 W, 24 kHz for 30 min. Subsequently, 0.14 g of iron(III) sulphate and 10.0 g of sodium peroxodisulphate dissolved in 80 g of water were added under nitrogen. The solution was pumped through the ultrasound flow cell with stirring and irradiated for a further 3 h. Subsequently, 8.4 g of sodium peroxodisulphate dissolved in 80 g of water were added under nitrogen and the solution was pumped through the ultrasound flow cell with stirring and irradiated for a further 8 h. The solution was kept at 25° C. by external cooling over the entire reaction time.

On completion of the reaction, the dispersion was discharged and desalinated by adding 172 g of Lewatit MP 62 (basic ion exchanger, Lanxess AG) and 148 g of Lewatit S 100 (acidic ion exchanger, Lanxess AG) with stirring on a magnetic stirrer without ultrasound for 2 h. The ion exchanger was filtered off through a filter cloth.

The inventive PEDOT/PSS dispersion thus obtained has a solids content of 1.35% by weight and a viscosity of 55 mPas at a shear rate of 100/sec (measured with a rheometer at 20° C.). The electrical conductivity was determined as described above after adding dimethyl sulphoxide and was 245 S/cm.

The invention claimed is:

1. A process for preparing an aqueous or nonaqueous dispersion or solution comprising at least one cationic polythiophene and at least one polyanion, in the form of a polythiophene/polyanion-complex, wherein cationic polythiophene is prepared in the presence of the polyanion and wherein the preparation is effected with ultrasound irradiation and wherein the thus obtained dispersion or solution has a viscosity at 20° C. between 1 and 100 mPas, measured with a rheometer at a shear rate of 100/sec, at a solids content of the polythiophene of 1.0 to 1.5% by weight.

2. The process according to claim 1, wherein the at least one cationic polythiophene is an optionally substituted polythiophene comprising repeat units of the formula (I)

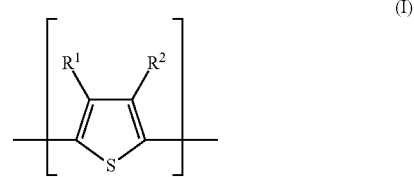

where $R^1$ and $R^2$ are each independently of each other H, an optionally substituted $C_1$-$C_{18}$-alkyl radical or an optionally substituted $C_1$-$C_{18}$-alkoxy radical, or $R^1$ and $R^2$ together are an optionally substituted $C_1$-$C_8$-alkylene radical in which one or more carbon atoms is optionally replaced by one or more identical or different heteroatoms selected from O and S.

3. The process according to claim 2, wherein $R^1$ and $R^2$ are an optionally substituted $C_1$-$C_8$-oxythiaalkylene radical or an optionally substituted $C_1$-$C_8$-dithiaalkylene radical, or an optionally substituted $C_1$-$C_8$-alkylidene radical in which at least one carbon atom is optionally replaced by a heteroatom selected from O and S.

4. The process according to claim 2, wherein at least one cationic polythiophene is a polythiophene containing repeat units of the formula (I-aaa) and/or of the formula (I-aba)

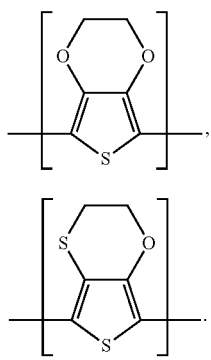

(I-aaa)

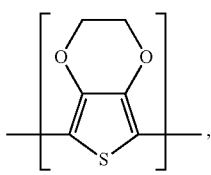

(I-aba)

5. The process according to claim 4, wherein the polyanion is polystyrenesulphonic acid.

6. The process according to claim 1, which further comprises adding conductivity enhancers to the aqueous or nonaqueous dispersion.

7. A process for preparing an aqueous or nonaqueous dispersion or solution comprising at least one cationic polythiophene and at least one polyanion, in the form of a polythiophene/polyanion-complex, wherein cationic polythiophene is prepared in the presence of the polyanion and wherein the preparation is effected wherein the process comprises the following steps:
  1) adding at least one oxidizing agent only after the reaction medium has been inertized with the aid of inert gas,
  2) performing the polymerization with ultrasound irradiation and
  wherein the thus obtained dispersion or solution has a viscosity at 20° C. between 1 and 100 mPas, measured with a rheometer at a shear rate of 100/sec, at a solids content of the polythiophene of 1.0 to 1.5% by weight.

8. The process according to claim 7, wherein at least one cationic polythiophene is a polythiophene containing repeat units of the formula (I-aaa) and/or of the formula (I-aba)

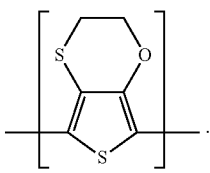

(I-aaa)

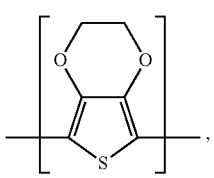

(I-aba)

9. The process according to claim 8, wherein the polyanion is polystyrenesulphonic acid.

10. A process for preparing an aqueous or nonaqueous dispersion or solution comprising at least one conductive polymer and at least one polyanion, wherein the process comprises the following steps:

performing the polymerization at a pressure below atmospheric pressure and with ultrasound irradiation.

11. The process according to claim 10, wherein at least one conductive polymer is a polythiophene containing repeat units of the formula (I-aaa) and/or of the formula (I-aba)

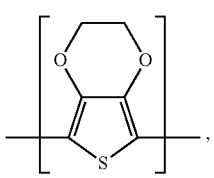

(I-aaa)

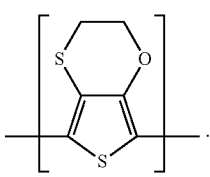

(I-aba)

12. The process according to claim 11, wherein the polyanion is polystyrenesulphonic acid.

* * * * *

UNITED STATES PATENT AND TRADEMARK OFFICE
CERTIFICATE OF CORRECTION

PATENT NO. : 8,721,928 B2
APPLICATION NO. : 12/864007
DATED : May 13, 2014
INVENTOR(S) : Jonas et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 474 days.

Signed and Sealed this
Twenty-ninth Day of September, 2015

Michelle K. Lee
*Director of the United States Patent and Trademark Office*